(12) United States Patent
Goodson

(10) Patent No.: US 9,108,232 B2
(45) Date of Patent: Aug. 18, 2015

(54) MEGASONIC MULTIFREQUENCY APPARATUS WITH MATCHED TRANSDUCERS AND MOUNTING PLATE

(75) Inventor: J. Michael Goodson, Skillman, NJ (US)

(73) Assignee: MEGASONIC SWEEPING, INCORPORATED, Trenton, NJ (US)

( * ) Notice: Subject to any disclaimer, the term of this patent is extended or adjusted under 35 U.S.C. 154(b) by 571 days.

(21) Appl. No.: 12/618,644

(22) Filed: Nov. 13, 2009

(65) Prior Publication Data

US 2011/0094548 A1     Apr. 28, 2011

Related U.S. Application Data

(63) Continuation-in-part of application No. 12/592,261, filed on Oct. 28, 2009, now abandoned.

(51) Int. Cl.
*B08B 3/12*         (2006.01)
*H01L 21/67*        (2006.01)
*H01L 21/449*       (2006.01)

(52) U.S. Cl.
CPC ............... *B08B 3/12* (2013.01); *H01L 21/449* (2013.01); *H01L 21/67051* (2013.01); *H01L 21/67057* (2013.01); *B08B 2203/0288* (2013.01)

(58) Field of Classification Search
CPC   B08B 3/12; B08B 2203/0288; H01L 21/449; H01L 21/67051
USPC .......................................................... 134/184
See application file for complete search history.

(56) References Cited

U.S. PATENT DOCUMENTS

| 4,804,007 | A | * | 2/1989 | Bran .............................. 134/184 |
| 4,836,684 | A | * | 6/1989 | Javorik et al. ................. 366/114 |
| 5,119,840 | A | | 6/1992 | Shibata |
| 6,019,852 | A | * | 2/2000 | Pedziwiatr et al. ............... 134/1 |
| 6,314,974 | B1 | * | 11/2001 | Schuler et al. ................. 134/184 |
| 7,238,085 | B2 | | 7/2007 | Montierth et al. |
| 7,247,977 | B2 | | 7/2007 | Goodson |
| 7,334,588 | B2 | | 2/2008 | Verhaverbeke et al. |
| 7,586,235 | B2 | | 9/2009 | Gouk |

(Continued)

FOREIGN PATENT DOCUMENTS

| CN | 1428309 | 7/2003 |
| EP | 0913209 A2 | 5/1999 |
| WO | WO2005044440 A2 | 5/2005 |

OTHER PUBLICATIONS

CN201080061384.8 Office Action and Search Report issued Mar. 17, 2014.

(Continued)

*Primary Examiner* — Michael Barr
*Assistant Examiner* — Levon J Shahinian
(74) *Attorney, Agent, or Firm* — K&L Gates LLP

(57) ABSTRACT

A megasonic processing apparatus matches the fundamental resonant or higher-level harmonic frequencies of megasonic thickness-mode transducers to the fundamental resonant or higher-level harmonic frequencies of a plate or other mounting structure upon which the transducers are mounted. The multifrequency transducers are piezoelectric transducers operating in thickness mode at different operating frequencies. The thickness of the mounting plate at the transducer locations is selected to provide a resonant or harmonic frequency matched to that of its corresponding transducer. Two or more megasonic transducers are bonded to the same radiating surface.

15 Claims, 9 Drawing Sheets

(56) References Cited

U.S. PATENT DOCUMENTS

| | | | |
|---|---|---|---|
| 7,598,654 B2* | 10/2009 | Goodson | 310/317 |
| 7,655,095 B2 | 2/2010 | Farrar | |
| 2008/0139974 A1 | 6/2008 | Da Silva | |
| 2008/0312460 A1 | 12/2008 | Goodson | |
| 2008/0314424 A1* | 12/2008 | Verhaverbeke et al. | 134/58 R |
| 2009/0241986 A1 | 10/2009 | Puskas | |

OTHER PUBLICATIONS

AU2010319547, Examination Report No. 1 dated Jul. 11, 2013, 3 pages.
AU2010319547, Examination Report No. 2 dated Jul. 31, 2014, 2 pages.
CN201080061384.8, Second Office Action dated Sep. 10, 2014, 9 pages.
EP10830678.8, European Search Report dated Aug. 28, 2014, 7 pages.
PH12012501179, Examination Report dated Feb. 19, 2014, 1 page.
PCT/US2010/056265, Search Report and Written Opinion dated Jan. 11, 2011, 10 pages.
KR1020127015309, Non-Final Rejection dated Jan. 15, 2014, 2 pages.
SG2012043311, Examination Report dated May 29, 2014, 6 pages.
SG2012043311, Search Report and Written Opinion dated Aug. 15, 2013, 14 pages.
CA2786389, Examination Report dated Nov. 27, 2014, 4 pages.

* cited by examiner

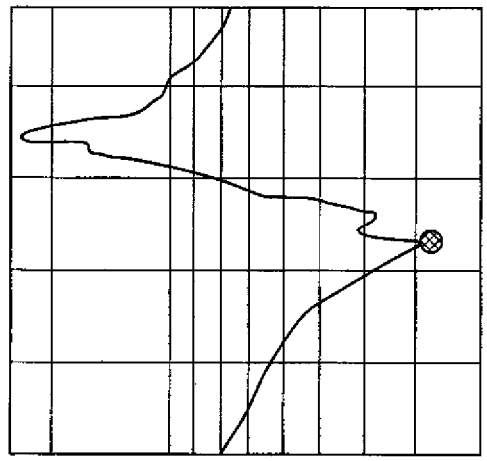
FIG. 8(a) METAL 470 KHz 1st HARMONIC
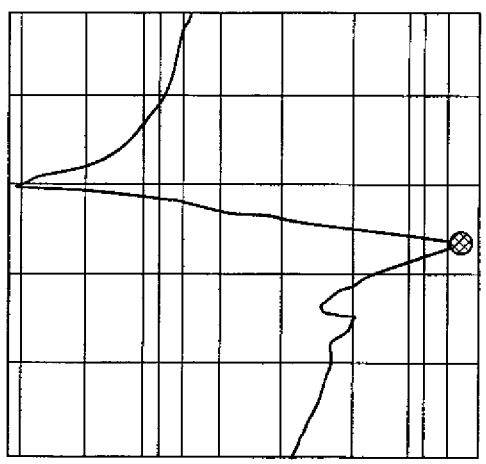
FIG. 8(b) METAL 1560 KHz 3rd HARMONIC
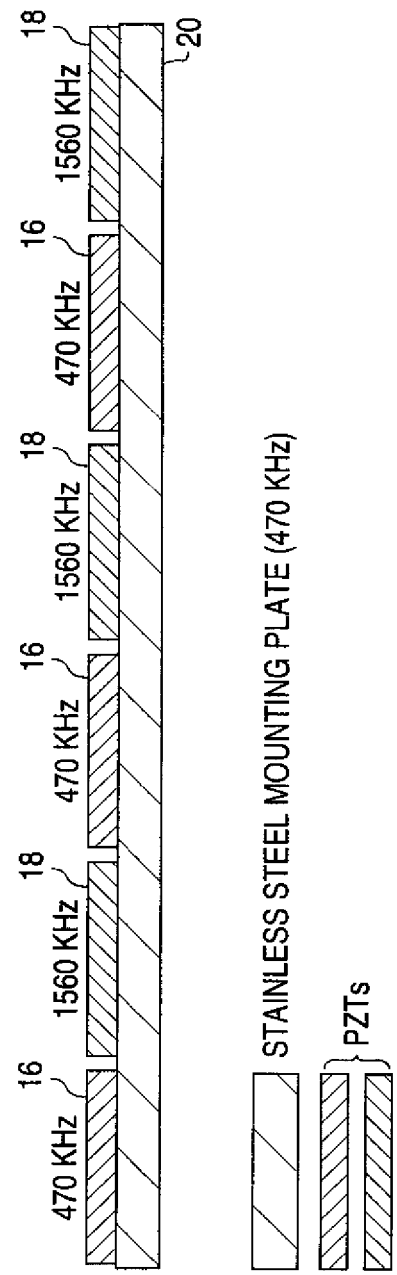
FIG. 9

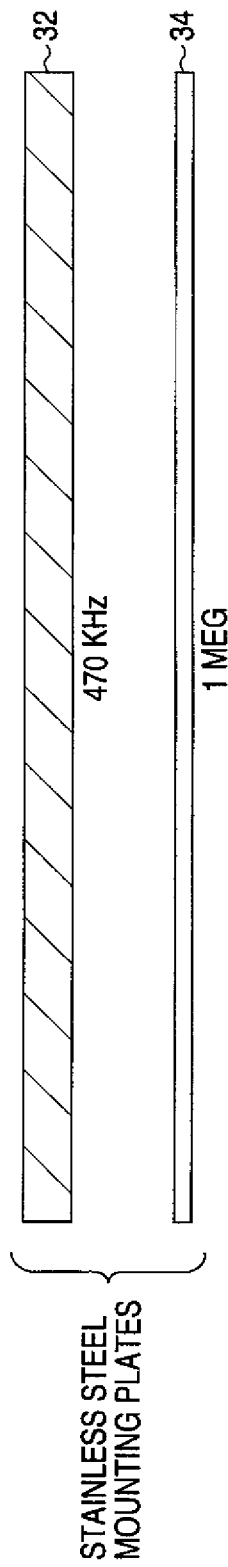
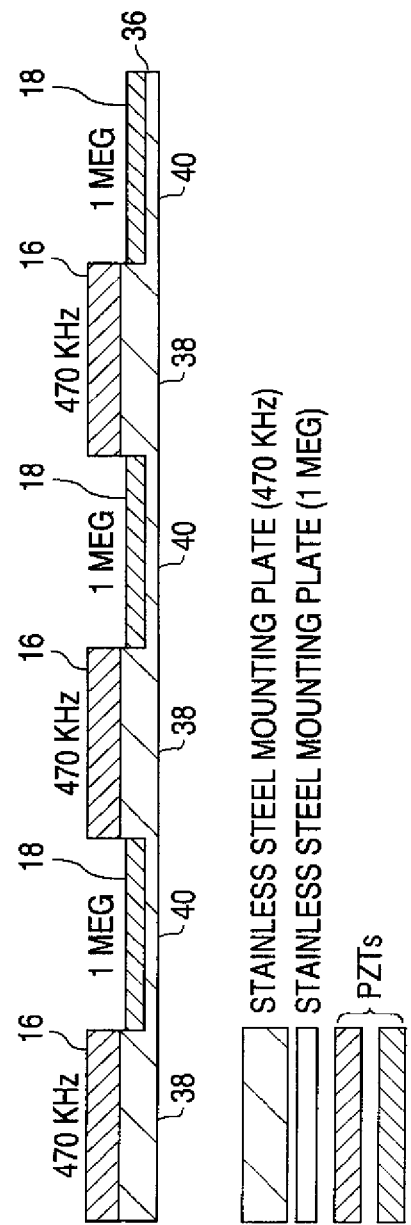
FIG. 10
FIG. 11

US 9,108,232 B2

MEGASONIC MULTIFREQUENCY APPARATUS WITH MATCHED TRANSDUCERS AND MOUNTING PLATE

RELATED APPLICATION

This application is a continuation-in-part application of co-pending U.S. application Ser. No. 12/592,261 filed Oct. 28, 2009, entitled METHODS FOR CREATING MEGASONIC MULTIFREQUENCIES IN A CONTINUES PROCESS, and invented by J. Michael Goodson.

BACKGROUND OF THE INVENTION

1. Field of the Invention

This invention relates generally to megasonic processing apparatus and associated methods involving two or more piezoelectric transducers operating in thickness mode at different megasonic frequencies of at least 300 KHz or higher, and relates more particularly to improving performance by matching the fundamental resonant or higher-level harmonic frequencies of multifrequency transducers to the fundamental resonant or higher-level harmonic frequencies of a plate or other mounting structure upon which the transducers are mounted.

2. Description of the Relevant Art

Megasonic processing involves generating and using high frequency energy at frequencies above 300 KHz. Many megasonic systems operate at frequencies at or near 1,000 KHz (1 MHz). Although 1 MHz is the consensus, preferred frequency for many applications, the frequency range goes much higher, with frequencies as high as 10 MHz. Typical uses for megasonic systems include cleaning delicate objects, such as semiconductor wafers and disc drive media. Such a megasonic cleaning process involves placing the objects to be cleaned in a fluid-filled tank, and applying vibrational energy at megasonic frequencies to a radiating surface or surfaces of the tank. One or more piezoelectric transducers (PZT) are used to generate the vibrational energy. The PZTs are bonded or otherwise attached to a plate or tank but without external pressure or compression. A generator supplies an alternating current driving signal to the transducers. Megasonic transducers operate in thickness mode, where a piezoelectric element is excited by an alternating current driving signal that causes alternating expansion and contraction of the transducer, primarily expanding and contracting the thickness of the transducer. A piezoelectric transducer having a thickness of 0.080 inches has a fundamental, thickness mode, resonant frequency of 1,000 KHz. A thinner PZT will have a higher resonant frequency in thickness mode, and a thicker PZT will have a lower resonant frequency in thickness mode. It is known to sweep the driving frequency throughout a range of frequencies, as disclosed in my U.S. Pat. No. 7,598,654, to improve distribution and uniformity of the high frequency energy.

Megasonic processing happens at much higher frequencies than ultrasonic processing, which involves fundamental frequencies typically in the range of 25 KHz to 40 KHz and upper-level harmonics upwards of about 300 KHz. Ultrasonic transducers are typically mass-balanced, with inert masses on either side of a piezoelectric element, and have a significant radial component of movement at right angles to the thickness. The PZTs are circular rings with the centers cut out, and their frequency is determined by the relationship of the inside diameter to the outside diameter. One common construction of an ultrasonic transducer is to stack one or more ring-shaped piezoelectric elements between two masses, and to hold the assembly together with an axial compression bolt. Compressing a radial PZT increases its vibration amplitude, which is the reverse of what happens with a thickness mode PZT. Ultrasonic cleaning is based on cavitation, which is the formation and collapse of bubbles in the fluid.

At the frequencies used for megasonic cleaning, significant cavitation does not occur, so the cleaning action is based on another mechanism known as micro-streaming, which is a general flow of detached particles flowing away from the megasonic transducers. This flow consists of planar waves originating at the surface to which the transducers are mounted. If the transducers are mounted on the bottom of the tank, then the planar waves move upward in a vertical direction. The planar nature of these micro-streams affects the distribution of megasonic energy throughout the tank. There is little or no activity opposite empty spots or gaps between the megasonic transducers. One way to maximize the distribution is to cover a high percentage (e.g., 80-90%) of the surface area of the tank with transducers. Another but less efficient way is to oscillate or move the parts to be processed throughout the tank so that all surfaces are exposed to sufficiently high megasonic energy.

It is known to use multiple transducers of different frequencies in an ultrasonic apparatus, as shown for example in U.S. Pat. No. 6,019,852. This patent discloses mounting lower frequency transducers on a thicker plate than higher frequency transducers to counter excessive erosion caused by the lower frequency transducers.

SUMMARY OF THE INVENTION

The present invention relates to a megasonic processing apparatus having two piezoelectric transducers (PZT) operating in thickness mode at fundamental resonant frequencies of at least 300 KHz. First and second transducers have corresponding first and second operating frequencies that are different. A mounting plate is provided for mounting the transducers. At the location of the first transducer the mounting plate has a first thickness and has a fundamental resonant or harmonic frequency substantially equal to the first operating frequency. At the location of the second transducer the mounting plate has a second thickness and has a fundamental resonant or harmonic frequency substantially equal to the second operating frequency. The apparatus also includes a tank containing a liquid and one or more parts to be processed. The mounting plate is operatively coupled to the tank so that the transducers provide vibrations to the tank and its contents. The apparatus also includes one or more generators coupled to the transducers for supplying driving signals at the first and second operating frequencies.

The mounting plate has a resonant frequency that is matched to an operating frequency of the transducers. In one embodiment of the invention, the transducers all have substantially the same dimensions, but some are operated at a fundamental resonant frequency and others are operated at a third harmonic frequency. The mounting plate has a uniform thickness and has a fundamental resonant frequency that is substantially equal to a fundamental resonant frequency of the transducers, and also has a third harmonic frequency that is substantially equal to a third harmonic frequency of the transducers. For example, the transducers have a fundamental resonant frequency of about 470 KHz and a third harmonic frequency of about 1560 KHz. Accordingly, the mounting plate has a fundamental resonant frequency of about 470 KHz and a third harmonic frequency of about 1560 KHz, to match the transducers.

This embodiment has the advantage that the mounting plate has a uniform thickness and the third-harmonic transducers are the same dimensions as the fundamental resonant frequency transducers. Alternatively, the higher frequency transducers could be based on a thinner PZT that is driven at its fundamental resonant frequency instead of a higher-order harmonic. For example, a 0.23 inch thick PZT will have a fundamental resonant frequency of 470 KHz and a third harmonic of 1560 KHz, whereas the PZT thickness would have to be reduced to about 0.05 inches to obtain a fundamental resonant frequency of 1560 KHz. The thicker PZT operated at its third harmonic is more durable and resistant to crack formation than the thinner PZT operated at its fundamental resonant frequency.

Preferably, there are multiple first transducers (operating at the fundamental resonant frequency) and multiple second transducers (operating at the third harmonic frequency) and are arranged in an alternating sequence on the mounting plate. The transducers operate in thickness mode and are preferably long rectangles with the length extending across one dimension of the mounting plate.

In other embodiments, the mounting plate has a non-uniform thickness. For example, the mounting plate may not match both the fundamental and harmonic frequencies of the transducers. The fundamental resonant frequencies of the mounting plate and the transducers may be matched, but the third harmonics are not matched. In this situation, the thickness of the mounting plate is adjusted at the mounting location second transducer so that the third harmonics are matched. Alternatively, the third harmonic frequencies of the mounting plate and the transducers may be matched, but the fundamental resonant frequencies are not. In order to match the fundamental resonant frequencies, the thickness of the mounting plate is adjusted at the mounting location of the first transducer.

In another embodiment, the mounting plate has different thicknesses selected so that its fundamental resonant frequencies match the operating frequencies of the corresponding first and second transducers. The thickness of the mounting plate at the mounting location of a transducer is selected to allow the mounting plate to resonant in its fundamental resonant mode at the operating frequency of the transducer. The thickness of the mounting plate will be thinner at the location of the higher frequency transducer. The reduced thickness of the mounting plate at the location of the higher frequency transducers can be made by machining a thicker plate to remove the excess material. Alternatively, the plate may start with a thin plate having a fundamental resonant frequency matched to the higher operating frequency of the transducers, and additional material may be added to bring the thickness up to that required to match the fundamental resonant frequency of the lower operating frequency. Another alternative is to die cast or mold the mounting plate in a die or mold that is patterned to result in the desired thicknesses of the mounting plate. The die casting or molding process can use aluminum or other metals. Powdered metals may be used as materials for fabricating the mounting plate. Preferably, there are multiple first transducers operating at the fundamental resonant frequency and multiple second transducers operating at a different fundamental resonant frequency. These transducers are arranged in an alternating sequence on the mounting plate. The transducers operate in thickness mode and are preferably long rectangles with the length extending across one dimension of the mounting plate.

In yet another embodiment, an array of several transducers is provided that has a many different operating frequencies within a range of frequencies. The transducers may be arranged in a sequence from the lowest to the highest operating frequencies, or in other non-sequential arrangements as well. This embodiment is intended for use with a tank that includes a transport mechanism to convey the parts to be processed from one end of the tank to the other, thus subjecting them to all the various frequencies emitted by the transducers.

The features and advantages described in the specification are not all inclusive, and particularly, many additional features and advantages will be apparent to one of ordinary skill in the art in view of the drawings, specification and claims hereof. Moreover, it should be noted that the language used in the specification has been principally selected for readability and instructional purposes, and may not have been selected to delineate or circumscribe the inventive subject matter, resort to the claims being necessary to determine such inventive subject matter.

BRIEF DESCRIPTION OF THE DRAWINGS

FIGS. 8(a) and 8(b) are graphs of signal impedance as a function of frequency for an ultrasonic signal propagated through a metal mounting plate.

FIG. 9 is a side view of one embodiment of the present invention employing a mounting plate of uniform thickness and transducers operating first and third harmonic frequencies.

FIG. 10 is a side view of two mounting plates.

FIG. 11 is a side view of another embodiment of the present invention employing a mounting plate having two thicknesses at transducer mounting locations.

DETAILED DESCRIPTION OF THE PREFERRED EMBODIMENTS

Figure 1:
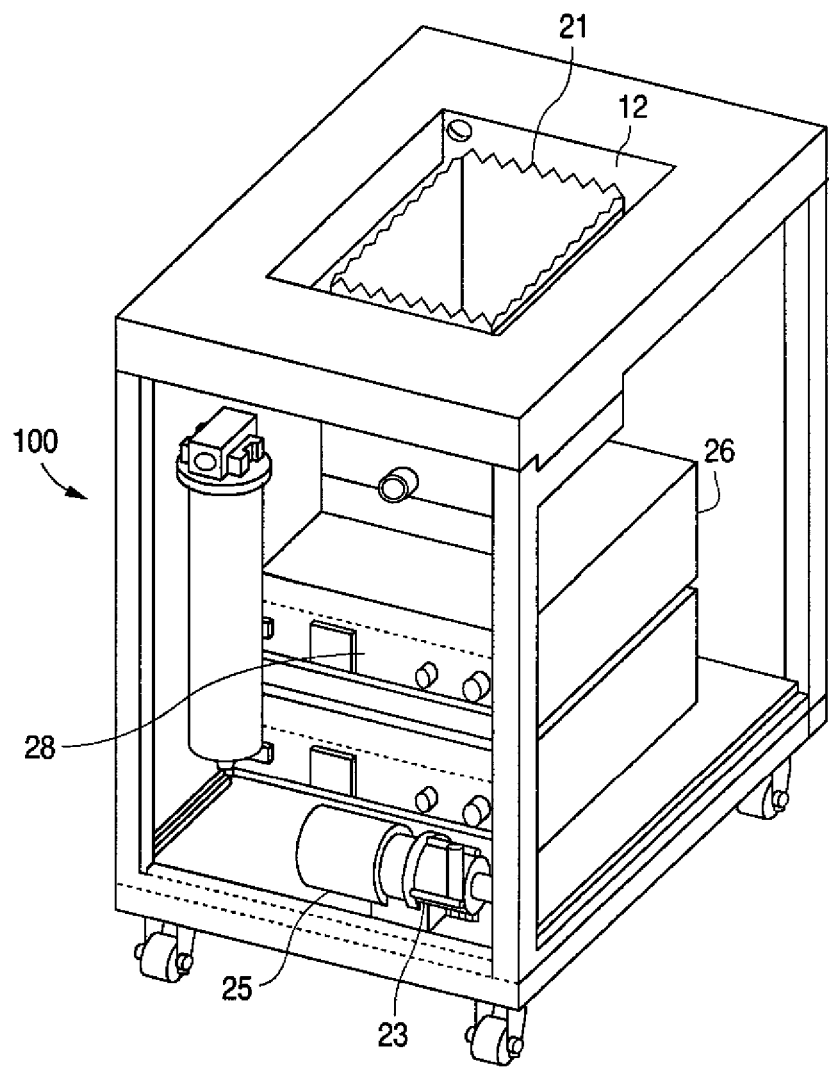
FIG. 1 is an overall perspective view of a megasonic multifrequency processing system according to the present invention.

The drawings depict various preferred embodiments of the present invention for purposes of illustration only. One skilled in the art will readily recognize from the following discussion that alternative embodiments of the structures and methods illustrated herein may be employed without departing from the principles of the invention described herein.

One aspect of the present invention is matching the fundamental resonant or higher harmonic frequencies of a transducer mounting plate to the operating frequencies of the multifrequency transducers mounted on it. The transducers have different operating frequencies, either a fundamental resonant or higher harmonic frequency, in order to supply a mixture of megasonic frequencies to the tank and the parts therein to be processed. The transducers are thickness mode megasonic transducers having fundamental resonant frequencies of at least 300 KHz. The megasonic transducers may be mounted on or attached to the bottom or sides of a tank, or enclosed in an immersible container within the tank. Preferably, the transducers are piezoelectric crystals or piezoelectric ceramic (also known as PZTs), such as barium titanate or lead zirconate titanate, operating in thickness mode. Matching a thickness-mode resonant or harmonic frequency of the mounting plate to the operating frequencies of the megasonic transducers enhances the transfer of energy from the transducers to the tank.

The transducers are mounted on a mounting plate, surface of a tank, or other structure. For convenience, any structure upon which the transducers are mounted will be referred to herein as a mounting plate, but this term is intended to be all-inclusive of transducer mounting structures, whether integral with or separate from a tank structure. The material of the mounting plate can be metal, hi-tech ceramics, carbon, quartz or other substances that have a high capacity for transmitting sound. Referenced frequencies are based on stainless steel for illustration purposes only. Each of the above referenced materials has its own thickness mode frequencies.

As shown in FIGS. 1-6, one embodiment of the present invention is a cleaning system 10 that includes a cleaning tank 12 containing a cleaning liquid or solution 14 and one or more pieces 15 to be cleaned. Megasonic energy is supplied to the cleaning liquid 14 by megasonic frequency transducers 16 and 18 affixed to the bottom of the tank 12 or to a mounting plate 20 attached to or integral with the tank. Alternatively, megasonic transducers could be affixed to one or more sides of the tank or immersed in the tank. Preferably, the megasonic transducers 16 and 18 have piezoelectric elements (PZT) that are adhesively bonded or otherwise attached to the tank 12 or mounting plate 20. The transducers 16 and 18 may be adhesively bonded or otherwise attached to a silicon carbide plate that in turn is attached to the tank 12 or mounting plate 20. Preferably, bonding layers 22 between the transducers 16 and 18 and the tank 12 or mounting plate 20 are composed of perforated copper foil and an impedance matching adhesive. Alternatively, the bonding layers may be composed of epoxy or other adhesive used for die bonding semiconductor chips to package substrates.

The piezoelectric element can be square, rectangular, or a circular disk, or other shape having uniform thickness. For example, for operation at a nominal frequency of 1,000 KHz, the piezoelectric element would have a thickness of about 0.08 inches and the bottom of the quartz tank 12 would have a thickness of about 0.20 inches. Transducer 16 and 18 and cleaning system 10 is just one example of a transducer and apparatus that incorporates the present invention.

As shown in FIGS. 3-6, the transducers 16 and 18 are preferably rectangular in shape and are arranged parallel to each other in an alternating sequence that includes several of each transducer. Preferably, the transducers 16 and 18 cover a substantial portion of the bottom surface of the tank 12, preferably at least 80%. It is desirable to generate megasonic energy and transfer it to the tank 12 and fluid 14 uniformly throughout the entire area of the surface to which the transducers 16 and 18 are attached. Covering a high percentage of the surface area of the tank bottom with transducers ensures that the megasonic energy transferred to the fluid 14 is relatively uniform.

Figure 6:
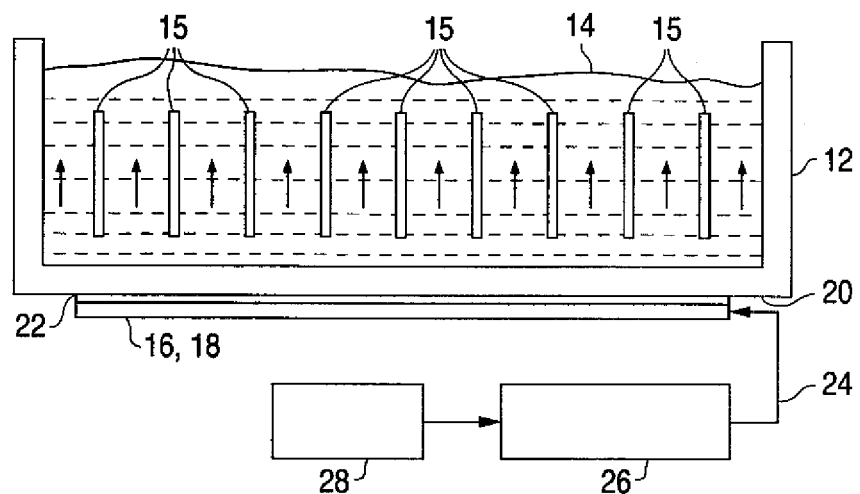
FIG. 6 is a schematic view of the megasonic multifrequency processing system and a sectional view of the tank and an attached megasonic transducer with a generator that supplies driving signals to the transducer for creating megasonic vibrations in liquid in the tank.

As shown in FIG. 6, the transducers 16 and 18 are driven by a driving signal supplied over electrical wires 24 by a programmable generator 26. The generator 26 is programmed by a user through a user input or interface 28 to set characteristics of the driving signal output by the generator.

Figure 2:
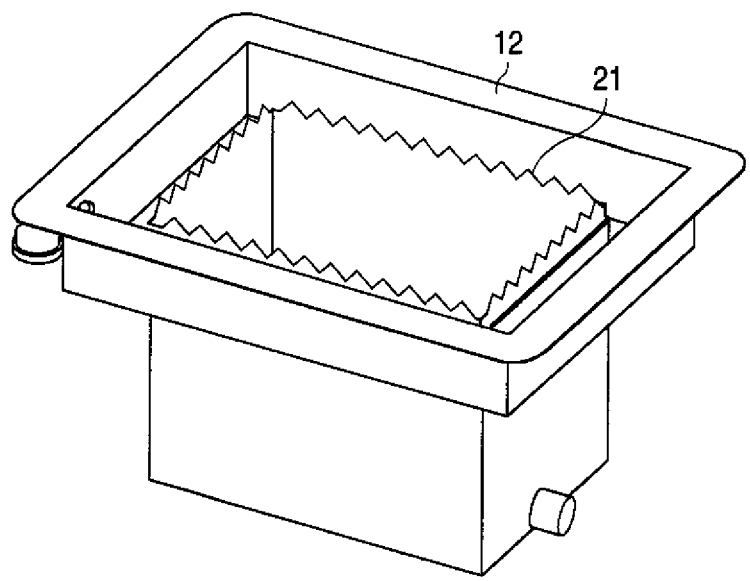
FIG. 2 is a top perspective view of a tank used in the megasonic multifrequency processing system of the present invention.
Figure 3:
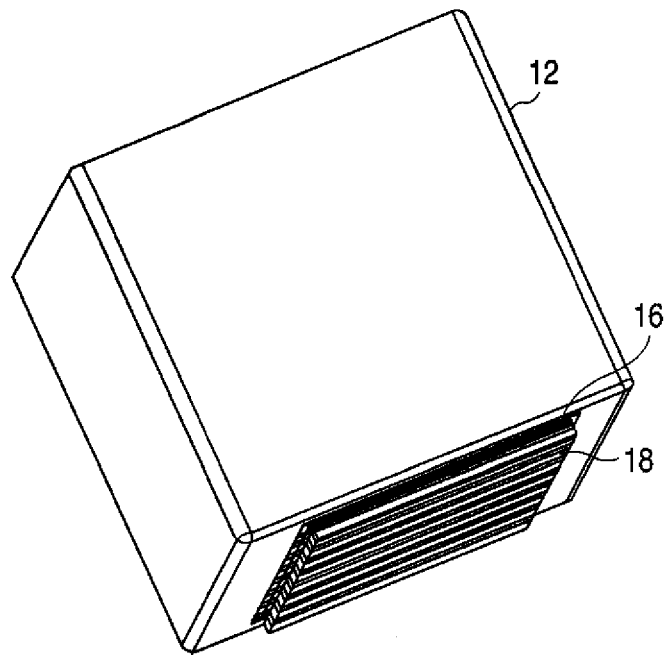
FIG. 3 is a bottom perspective view of the tank.
Figure 4:
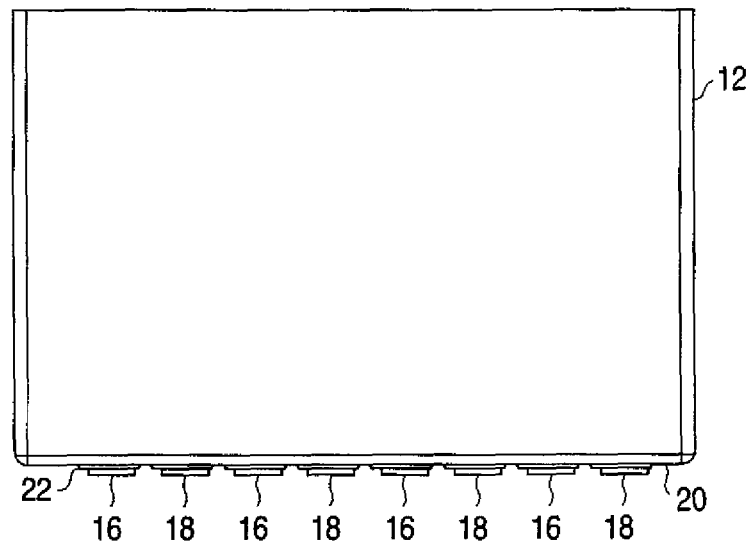
FIG. 4 is a side elevation view of the tank.
Figure 5:
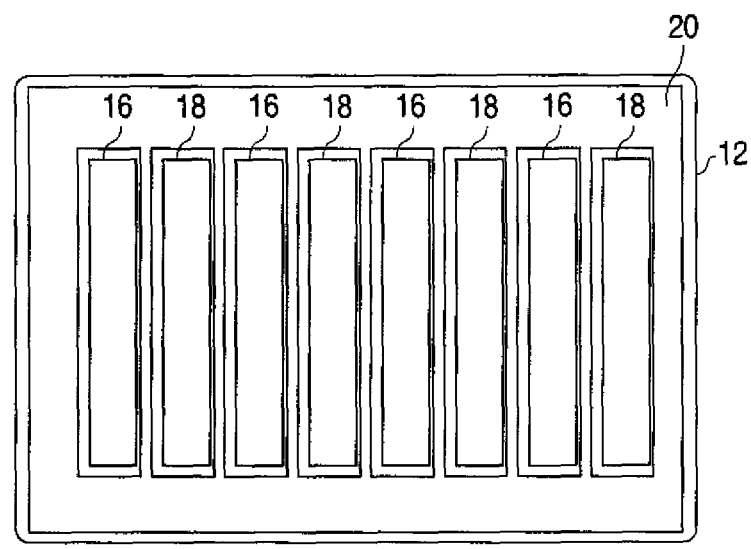
FIG. 5 is a bottom view of the tank.

A megasonic frequency piezoelectric transducer operates in thickness mode such that applied voltages cause the transducer to expand and contract in thickness. These expansions and contractions are transmitted through the tank 12 or mounting plate 20 to the fluid 14 and objects 15 in the tank. As shown by dashed lines in FIG. 6, these megasonic-frequency vibrations are primarily horizontal waves, assuming that the transducers 16 and 18 are on the bottom of the tank 12. The waves propagate upwards as indicated by the arrows in FIG. 6 and convey particles cleaned or separated from the objects 15 in the tank. This is a processed known as micro-streaming, in which there is a net movement upward, away from the source of megasonic energy. As shown in FIGS. 1 and 2, the tank has a weir 21 over which excess fluid and particles flow, and a pump 23 and filter 25 to recirculate and clean the fluid.

The fundamental resonant frequency is generally the frequency where the mechanical and electrical properties of a transducer can most efficiently transmit sound waves. In megasonic transducers operating in thickness mode, the thickness of the transducer determines the fundamental resonant frequency. For example, a transducer that is 0.08 inches thick will have a fundamental resonant frequency of about 1,000 KHz. A transducer that is 0.065 inches thick will have a fundamental resonant frequency of about 1230 KHz. A transducer that is 0.05 inches thick will have a fundamental resonant frequency of about 1600 KHz. The term "resonant frequency" is used herein to mean the lowest, fundamental frequency where the transducer as installed has a natural resonance, sometimes referred to as a first harmonic frequency.

Structures like transducers and mounting plates also have natural resonances at higher-order harmonic frequencies, such as a third-harmonic frequency that is about three times the fundamental resonant frequency. A transducer may have both a fundamental resonant frequency and a third harmonic frequency that are strong and efficient enough for use in generating megasonic energy. Likewise, a mounting plate may have both a fundamental resonant frequency and a third harmonic frequency that are efficient at transmitting megasonic energy from the transducers to the contents of the tank. FIGS. 8(a) and 8(b) illustrate the signal impedance as a function of frequency for a stainless steel mounting plate having a uniform thickness. FIG. 8(a) shows a low impedance and thus good transmission by the mounting plate at a first harmonic or fundamental resonant frequency of 470 KHz. FIG. 8(b) shows that the same stainless steel mounting plate has low impedance at its third harmonic frequency of 1560 KHz. The low impedances indicate resonance of the mounting plate.

FIG. 9 illustrates one embodiment of the present invention in which the mounting plate has a uniform thickness and the transducers 16 and 18 operate at their fundamental resonant (first harmonic) and third-harmonic frequencies, respectively. The transducers 16 and 18 are the same construction, but one is driven at its fundamental (first harmonic) resonant frequency and the other is driven at its third harmonic frequency. For example, a PZT that is 0.23 inches thick will have a first harmonic frequency of 470 KHz and a third harmonic frequency of 1560 KHz. Preferably, the lower-frequency transducers 16 are driven by one generator, and the higher-frequency transducers 18 are driven by another generator.

Alternatively, the transducers 18 can be designed to operate at a fundamental resonant (first harmonic) frequency of the third harmonic frequency of a uniform thickness mounting plate. A first harmonic of 1560 KHz would require a PZT that is about 0.05 inches thick, which is considerably thinner than 0.23 inches. The thinner PZT may be less reliable in operation than the thicker PZT because the thicker PZT is more resistant to crack formation and breakage.

By matching the fundamental resonant (first harmonic) frequencies of the transducers and the mounting plate, the third harmonic frequencies should also be matched or close to being matched. If the first harmonic frequencies of the transducers and mounting plates are matched but the third harmonics are not sufficiently matched, then the thickness of the mounting plate can be adjusted. By changing the thickness of the mounting plate at the mounting locations of the third harmonic transducers, the third harmonic frequency of the mounting plate can be correspondingly adjusted to match that of the transducers. Increasing the thickness will lower the harmonic frequency of the mounting plate, and decreasing the thickness will raise the harmonic frequency.

Figure 12:
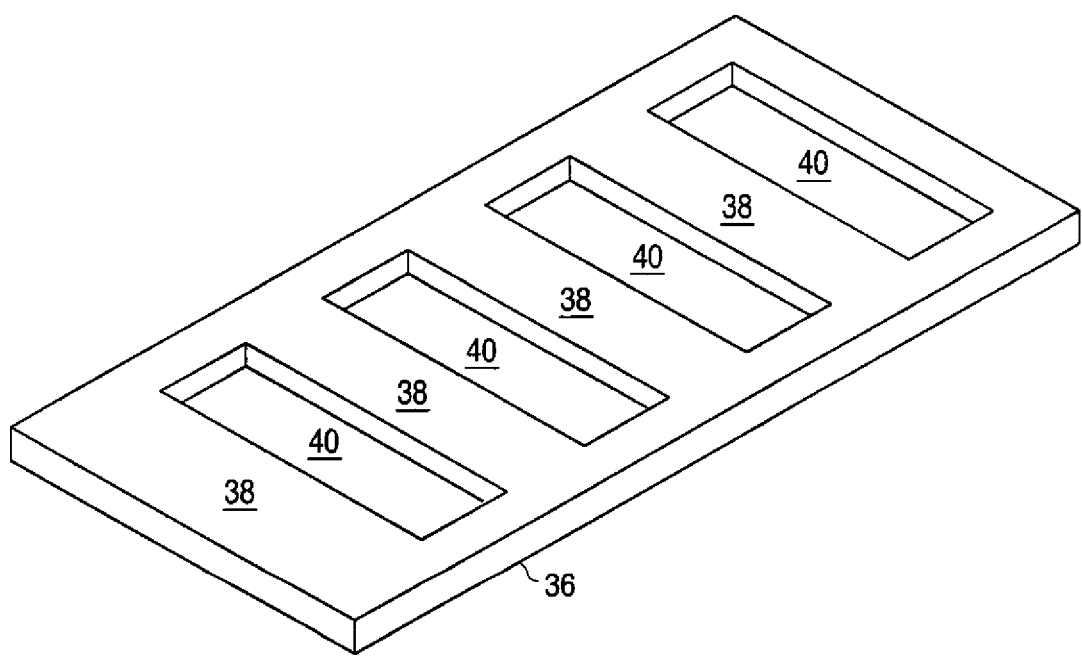
FIG. 12 is a perspective view of the mounting plate of FIG. 11.

In another embodiment, the mounting plate can be matched at its fundamental resonant (first harmonic) frequency to the operating frequency of transducer 18. This embodiment of the present invention is illustrated in FIGS. 10 and 11. Two mounting plates are shown in FIG. 10; a thicker plate 32 having a fundamental resonant (first harmonic) frequency of 470 KHz and a thinner plate 34 having a fundamental resonant frequency of 1000 KHz (1 Meg). The thicker plate 32 is resonance matched to 470 KHz transducers 16, and the thinner plate is resonance matched to 1000 KHz transducers 18. In order to use both transducers 16 and 18, the mounting plate 36 has two thicknesses—thicker at the mounting location 38 of the lower-frequency transducer 16 and thinner at the mounting location 40 of the higher-frequency transducer 18. This is shown in FIG. 11. To get the correct thickness of the mounting plate for the higher frequency one can start with a thick plate resonance matched to the lower-frequency transducers 16, and then machine areas of the plate down to the thickness required for the higher-frequency transducers 18. As shown in FIG. 12, the mounting locations 40 of the higher-frequency transducers 18 have been machined to a thinner thickness. The mounting locations 38 for the lower-frequency transducers 16 have not been machined.

Figure 13:
FIG. 13 is a side view of a mounting plate.
Figure 14:
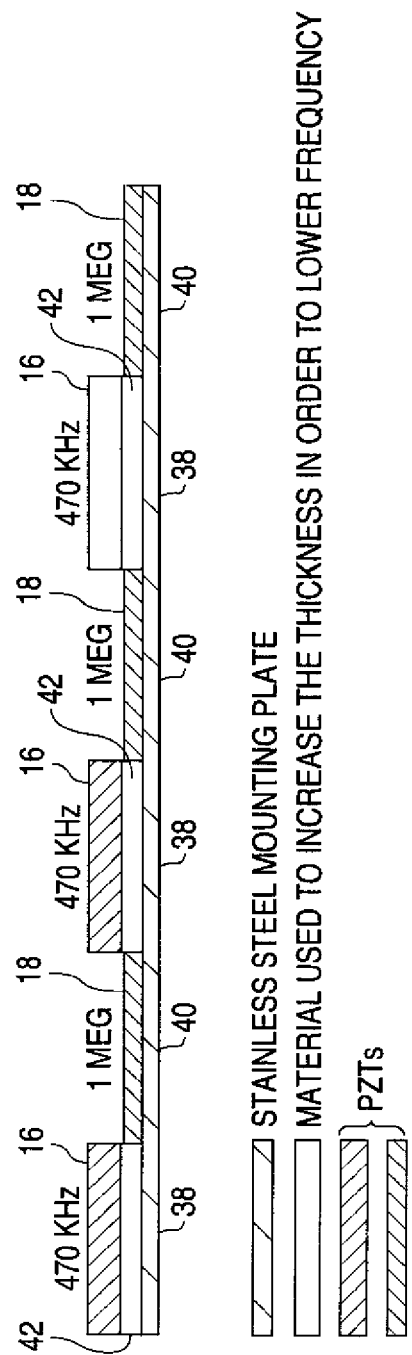
FIG. 14 is a side view of another embodiment of the present invention employing a mounting plate having two thicknesses at transducer mounting locations.

A similar result can be achieved by reversing the process, as shown in FIGS. 13 and 14. Starting with a thinner plate 34 matched to the higher-frequency transducers 18, material 42 is added at the mounting locations 38 of the lower-frequency transducers 16 to increase the thickness required to resonance match the lower operating frequency. Blocks of material 42 may be added to the thinner plate 34 by welding, brazing, bonding with glue or other adhesives, sintering, or other process.

Another alternative is to die cast or mold the mounting plate in a die or mold that is patterned to result in the desired thicknesses of the mounting plate. The die casting or molding process can use aluminum or other metals. Powdered metals may be used as materials for fabricating the mounting plate.

It is preferred that the thickness tolerance on the mounting plate be within 0.0005 inches of the nominal thickness that will provide the resonant or harmonic frequency matching to the transducers. Tighter tolerances may be obtained by die casting or molding, most suitable for high volume applications.

Figure 15:
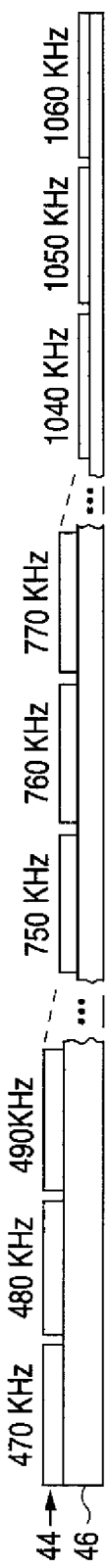
FIG. 15 is a side view of another embodiment of the present invention employing an array of transducers.

The invention as described above includes two groups of transducers, each having a different operating frequency. But the invention is not limited to only two frequencies, because the basic concept of matching resonance or harmonic frequencies of the mounting plate and the transducers is not limited to only two frequencies. FIG. 15 illustrates an embodiment with an array of sixty different transducers, each matched to the mounting plate at its location. The transducers 44 range from 470 KHz to 1060 KHz in steps of 10 KHz. The mounting plate 46 has a varying thickness, ranging from relatively thick at the low-frequency end of the transducer array, to relatively thin at the high-frequency end of the transducer array. The fundamental resonant (first harmonic) frequency of the mounting plate 46 is matched to the operating frequency of its corresponding transducer. Such a multi-frequency array provides a sequence of megasonic frequencies in the tank. This can be used for a continuous cleaning process where the parts to be processed are conveyed, automatically or manually, within the tank from one end to the other to subject them to all the frequencies generated by the transducer array. The progression can be upward or downward in frequency. Alternatively, the array can have alternating low and high frequency transducers with a gradual progression to other frequencies. Other sequences or progressions would be possible to implement according to this embodiment of the invention. The advantage of this multi-frequency array is that it substantially reduces risk in the handling of the parts being processed, yet subjects the parts to many different megasonic frequencies. Reducing the risk of damage from handling sensitive parts also improves yields.

Figure 7:
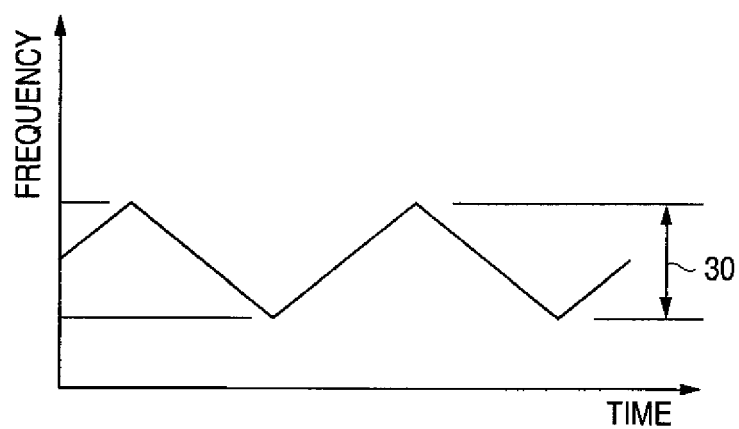
FIG. 7 is a graph of frequency versus time of a driving signal used in one embodiment of the present invention.

The present invention can enjoy the benefits of sweeping the driving frequency as described in my U.S. Pat. No. 7,598,654, which patent is incorporated by reference. As shown in FIG. 7, the generator 26 can vary the frequency of the driving signal as a function of time. For example, the frequency of the driving signal may vary linearly in a saw-tooth pattern over a programmed sweep frequency range 30. The sweep frequency range or bandwidth of the generator is programmed by a user and stored in a memory device associated with the generator 26. The rate at which the frequency varies is determined by the sweep rate programmed by the user and stored in the memory device of the generator. The generator can be programmed to vary the frequencies of the driving signal according to other functions or programs and need not be limited to linear functions that form a triangular wave or saw tooth pattern as shown in FIG. 7. The variation in frequency can be, for example, sinusoidal, exponential, and other functions. The driving signal itself may be sinusoidal, square, triangular, or other wave shape. The sweep rates need not be the same for sweeping upwards (increasing frequency) and downwards (decreasing frequency). Preferably, the user can also set the number of periods and can establish rest times when the generator shuts off the driving signal.

Commonly, multiple megasonic transducers of the same operating frequency are used for a given task or process, in which case it is common to drive all such transducers with the same generator and driving signal. Where multiple transducers are used, however, there may not be a single optimum frequency due to performance variations and manufacturing tolerances among the transducers. Production tolerances result in megasonic transducers having resonant frequencies within a 3% to 4% range. For example, at 1000 KHz, a 4% range would be plus or minus 20 KHz from the nominal 1000 KHz, or a range of 980 to 1020 KHz.

In such applications, according to the present invention, it is appropriate to repeatedly sweep the frequency of the driving signal to ensure that at least some of the time the transducers 16 and 18 are operating at or near its resonant or harmonic frequency. In order to have each transducer operate at or near its resonant or harmonic frequency, the generator sweeps through a frequency range that is designed to reach and exceed the lowest and highest resonant frequencies of a group of transducers. The sweeping frequency function of the generator 26 covers that range of variance. The frequency sweeping function can be fixed or it can be programmed to be variable as to speed (sweeps per second) or range (minimum and maximum frequencies).

The present invention is not limited to mounting plates or structures that are integral to the tank. The transducers can be enclosed in an immersible box or container and placed in the tank. The box or container has one surface that constitutes the mounting plate, as described herein, that is frequency matched to the transducers.

The application of the present invention is not limited to cleaning operations. The same principle of matching the mounting plate to the operating frequencies of the megasonic multifrequency transducers can be applied to other uses of micro-streaming of megasonic energy, such as non destructive testing, or any other applications using thickness mode transducers having fundamental resonant frequencies of at least 300 KHz. Matching the mounting plate frequencies to the multifrequency transducers is an efficient way to transfer energy, which create improved and stronger micro-streaming activity which improves the efficiency of micro-streaming cleaning and other uses of micro-streaming. Micro-streaming is a flow of energized liquid created by the release of ultrasonic energy that is too weak to cause cavitation. At frequencies in excess of 300 KHz, cavitations cease to exist but the megasonic frequency energy creates a flow of the liquid.

From the above description, it will be apparent that the invention disclosed herein provides a novel and advantageous megasonic processing apparatus and method utilizing a matched frequency mounting plate. The foregoing discussion discloses and describes merely exemplary methods and embodiments of the present invention. As will be understood by those familiar with the art, the invention may be embodied in various other forms without departing from the spirit or essential characteristics thereof. Accordingly, the disclosure of the present invention is intended to be illustrative, but not limiting, of the scope of the invention, which is set forth in the following claims.

What is claimed is:

1. A megasonic processing apparatus comprising:
   a first piezoelectric transducer operating in thickness mode and having a fundamental resonant frequency of at least 300 KHz and having a first operating frequency;
   a second piezoelectric transducer operating in thickness mode and having a fundamental resonant frequency of at least 300 KHz and having a second operating frequency different from the first operating frequency;
   a rectangular mounting plate upon which the first and second transducers are mounted, wherein the mounting plate has an area available for mounting transducers, wherein each first and second transducer is in the shape of a rectangle having a long side and a short side that is shorter than the long side, wherein the first and second transducers are arranged with the long sides parallel to each other and each transducer extends across one dimension of the mounting plate, wherein transducers cover at least 80% of the area of the mounting plate, wherein at the location of the first transducer the mounting plate has a first thickness and has a fundamental resonant or harmonic frequency substantially equal to the first operating frequency, and wherein at the location of the second transducer the mounting plate has a second thickness different from the first thickness and has a fundamental resonant or harmonic frequency substantially equal to the second operating frequency;
   a tank adapted to contain fluid and one or more parts to be processed, wherein said mounting plate is operatively coupled to the tank so that the transducers provide vibrations to the tank and its contents; and
   a generator coupled to the transducers for supplying driving signals at the first and second operating frequencies.

2. An apparatus as recited in claim 1 wherein the first operating frequency of the first transducer is its fundamental resonant frequency, and wherein the second operating frequency of the second transducer is its third harmonic frequency.

3. An apparatus as recited in claim 1 wherein the first operating frequency of the first transducer is its fundamental resonant frequency, wherein the second operating frequency of the second transducer is its fundamental resonant frequency, and wherein the fundamental resonant frequencies of the first and second transducers are different.

4. An apparatus as recited in claim 3 wherein the first thickness of the mounting plate has a fundamental resonant frequency substantially equal to the fundamental resonant frequency of the first transducer, and wherein the second thickness of the mounting plate has a fundamental resonant frequency substantially equal to the fundamental resonant frequency of the second transducer.

5. An apparatus as recited in claim 4 wherein the second thickness of the mounting plate is less than the first thickness of the mounting plate, and wherein the second thickness is formed by removing material from the mounting plate.

6. An apparatus as recited in claim 4 wherein the second thickness of the mounting plate is less than the first thickness of the mounting plate, and wherein the first thickness is formed by adding material to the mounting plate.

7. An apparatus as recited in claim 3 further comprising a plurality of first transducers and a plurality of second transducers, said transducers arranged on the mounting plate in alternating sequence.

8. An apparatus as recited in claim 1 further comprising a third piezoelectric transducer mounted on the mounting plate and having a fundamental frequency of at least 300 KHz, wherein the fundamental frequency of the third transducer is different from the fundamental frequencies of the first and second transducers, wherein the third transducer is in the shape of a rectangle having a long side and a short side shorter than the long side, and wherein the third transducer is arranged with its long side parallel to the long sides of the first and second transducers.

9. An apparatus as recited in claim 8 wherein the transducers are arranged in a sequence starting with the lowest operating frequency and progressing to the highest operating frequency.

10. An apparatus as recited in claim 8 further comprising a transport mechanism for moving the parts to be processed through the tank to subject the parts to vibrations provided by each transducer.

11. An apparatus as recited in claim 1 wherein the mounting plate is incorporated into the tank.

12. An apparatus as recited in claim 11 wherein the mounting plate is integral with the tank.

13. An apparatus as recited in claim 11 wherein the mounting plate is attached to the tank.

14. An apparatus as recited in claim 1 wherein the mounting plate is immersed in the tank.

15. An apparatus as recited in claim 1 wherein the generator supplies the driving signals at a variable frequency throughout a frequency range that includes the operating frequencies of the transducers.

* * * * *